United States Patent
Suzuki (10) Patent No.: US 9,415,455 B2
(45) Date of Patent: Aug. 16, 2016

(54) SEMICONDUCTOR DEVICE AND SEMICONDUCTOR DEVICE MANUFACTURING METHOD

(71) Applicant: FUJI ELECTRIC CO., LTD., Kawasaki-shi, Kanagawa (JP)

(72) Inventor: Kenji Suzuki, Azumino (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/721,529

(22) Filed: May 26, 2015

(65) Prior Publication Data
US 2016/0020161 A1   Jan. 21, 2016

(30) Foreign Application Priority Data
Jul. 15, 2014  (JP) .................. 2014-144861

(51) Int. Cl.
| | |
|---|---|
| H01L 23/42 | (2006.01) |
| B23K 1/19 | (2006.01) |
| H01L 21/48 | (2006.01) |
| B23K 1/00 | (2006.01) |
| H01L 23/373 | (2006.01) |

(52) U.S. Cl.
CPC .................. *B23K 1/19* (2013.01); *B23K 1/0006* (2013.01); *H01L 21/4882* (2013.01); *H01L 23/3735* (2013.01); *H01L 23/42* (2013.01); *B23K 2203/02* (2013.01); *B23K 2203/08* (2013.01); *B23K 2203/12* (2013.01); *B23K 2203/18* (2013.01); *B23K 2203/56* (2015.10); *H01L 2224/32225* (2013.01)

(58) Field of Classification Search
CPC .................................................. H01L 23/3736
See application file for complete search history.

(56) References Cited

U.S. PATENT DOCUMENTS

| | | | | |
|---|---|---|---|---|
| 5,889,323 A | * | 3/1999 | Tachibana | H01L 21/50 257/678 |
| 2015/0097281 A1 | * | 4/2015 | Adachi | H01L 23/473 257/714 |

FOREIGN PATENT DOCUMENTS

| | | |
|---|---|---|
| JP | 2001-168492 A | 6/2001 |
| JP | 2012-227362 A | 11/2012 |

* cited by examiner

*Primary Examiner* — William Harriston
(74) *Attorney, Agent, or Firm* — Manabu Kanesaka (57) ABSTRACT

A semiconductor device includes a semiconductor element; an insulating substrate formed from stacking a rectangular shaped circuit plate, insulating plate, and metal plate, wherein the semiconductor element is fixed to the circuit plate, and the metal plate has at least one first groove portion in four corners thereof; a radiating member made of metal and having a predetermined arrangement area to dispose the insulating substrate, the radiating member having at least one second groove portion provided in four corners of the arrangement area; four positioning members disposed between the four corners of the metal plate and the four corners of the radiating member, each of the four positioning members being fitted to each of the first groove portions and second groove portions; and a solder filling a space between the insulating substrate and the radiating member, and covering the positioning members.

12 Claims, 10 Drawing Sheets

SEMICONDUCTOR DEVICE AND SEMICONDUCTOR DEVICE MANUFACTURING METHOD

CROSS-REFERENCE TO RELATED APPLICATION

The present application is a US application claiming priority from Japanese Application No. 2014-144861 filed Jul. 15, 2014, the disclosure of which is incorporated herein.

BACKGROUND OF THE INVENTION

1. Field of the Invention

The present invention relates to a semiconductor device and semiconductor device manufacturing method.

2. Description of the Background Art

In a power semiconductor module, a semiconductor chip or the like is fixed with solder to one main surface of an insulating substrate, and a radiating member is fixed with solder to the other main surface of the insulating substrate.

However, in such a power semiconductor module, when the solder repeatedly expands and contracts due to temperature change occurring when operating, notches or the like may occur in the solder. Further, thermal strain concentrates in the notches, whereby fatigue damage occurs in the solder, which may cause breakdown or damage of the power semiconductor module.

Therefore, in order to restrict the occurrence of notches or the like in the solder, the following kind of technology is known. A plurality of pillars with a thermal expansion coefficient higher than that of the solder is disposed between the insulating substrate and radiating member, and the gap between the insulating substrate and radiating member is widened by the expanded pillars when the solder is heated. Therefore, the melted solder is raised upward, the solder is prevented from collapsing or flowing under its own weight, and the solder strain concentration is reduced by depressing the end portion inwardly (for example, refer to JP-A-2001-168492).

SUMMARY OF THE INVENTION

It is desirable that thermal conductivity from the insulating substrate to the radiating member is improved by widening the application region of the solder applied between the insulating substrate and radiating member. However, in the heretofore described technology, the application region of the solder is limited by the pillars disposed on the periphery of the solder. Also, in the heretofore described technology, because the thermal expansion of the pillars is utilized in order to widen the gap between the insulating substrate and radiating member, the insulating substrate and radiating member are not parallel when the thermal expansions of the individual pillars vary. Therefore, there is a concern that variation will occur in the thickness of the solder in the gap. When there is a variation in the thickness of the solder, there is also a variation in the thermal conductivity depending on the place of mounting on the insulating substrate. In this way, there is a decrease in the reliability of a semiconductor device obtained by using the heretofore described technology.

The invention, having been contrived bearing these points in mind, has an object of providing a semiconductor device and semiconductor device manufacturing method such that the concentration of a thermal strain occurring in solder is restricted, and high reliability is obtained.

According to one aspect of the invention, there is provided a semiconductor device including a semiconductor element; an insulating substrate formed from stacking a rectangular shaped circuit plate, insulating plate, and metal plate, wherein the semiconductor element is fixed to the circuit plate, and the metal plate has at least one first groove portion provided in the four corners thereof; a radiating member made of metal and having a predetermined arrangement area to dispose the insulating substrate, the radiating member having at least one second groove portion provided in four corners of the arrangement area; four positioning members disposed between the four corners of the metal plate and the four corners of the radiating member, each of the four positioning members being fitted to each of the first groove portions and second groove portions; and a solder filling a space between the insulating substrate and the radiating member, and covering the positioning members.

Also, according to one aspect of the invention, there is provided a semiconductor device manufacturing method including a step of preparing an insulating substrate formed from stacking a rectangular shaped circuit plate, insulating plate, and metal plate, the metal plate having at least one first groove portion provided in the four corners thereof; a step of preparing a radiating member made of metal, the radiating member having at least one second groove portion provided in the four corners of an arrangement area to dispose the insulating substrate; a step of fitting four positioning members in the second groove portion in the four corners of the arrangement area; a step of mounting a solder plate in the arrangement area; a step of fitting the four positioning members in the first groove portion in the four corners of the metal plate, to fix the insulating substrate in the arrangement area; a step of heating and melting the solder plate; a step of filling a space between the insulating substrate and the radiating member with solder melted from the solder plate; and a step of cooling and hardening the melted solder.

According to the disclosed technology, it is possible to attain a semiconductor device and semiconductor device manufacturing method such that concentration of thermal strain occurring in solder is prevented, and high reliability is obtained.

DETAILED DESCRIPTION OF THE INVENTION

A description will be given of embodiments, referring to the drawings.

First Embodiment

A description will be given of a semiconductor device of a first embodiment, using FIGS. 1 to 3C.

Figure 1:
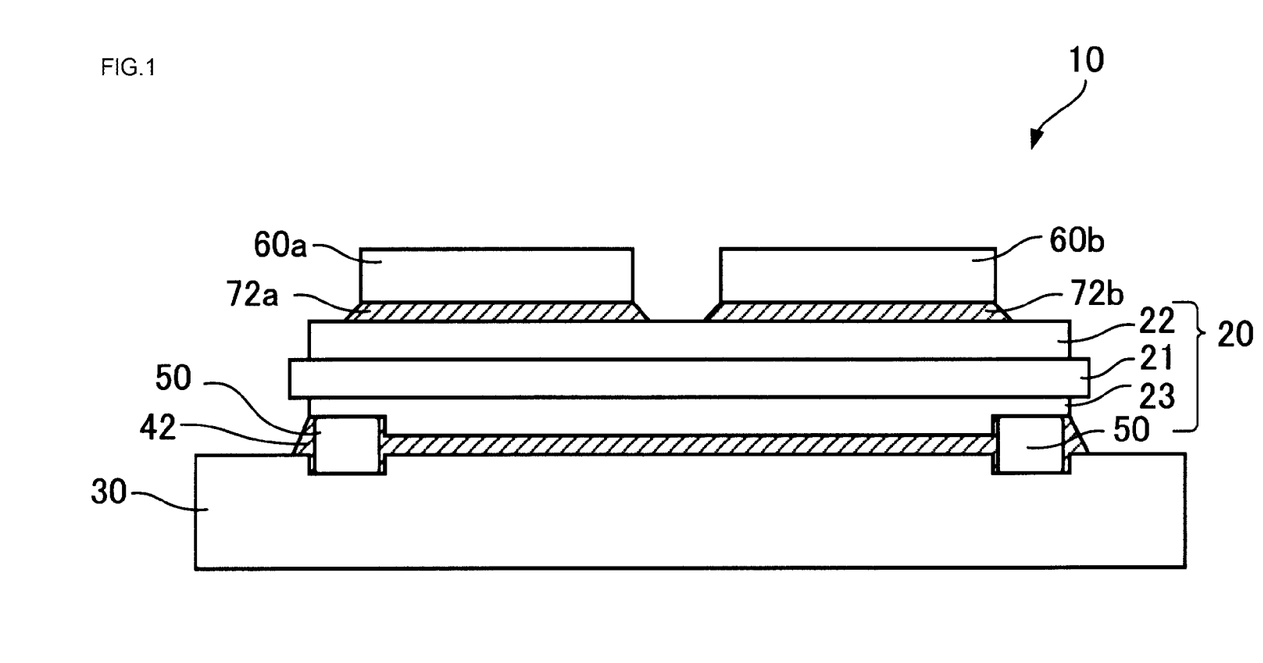
FIG. 1 is a sectional view of a semiconductor device of a first embodiment.

FIG. 1 is a sectional view of the semiconductor device of the first embodiment.

Figure 2A:
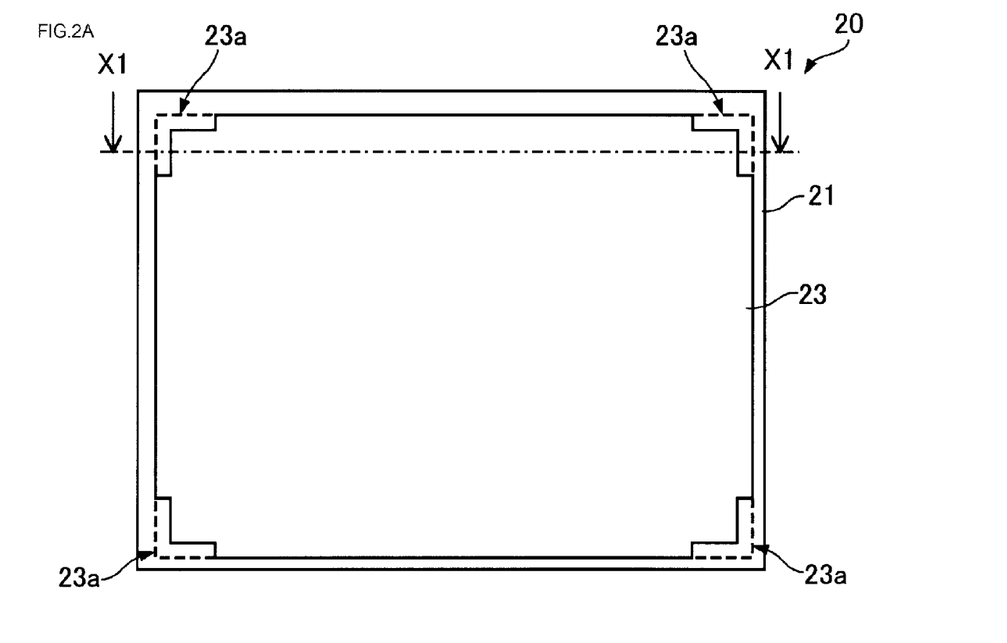
FIGS. 2A and 2B are diagrams for describing an insulating substrate of the first embodiment.
Figure 2B:
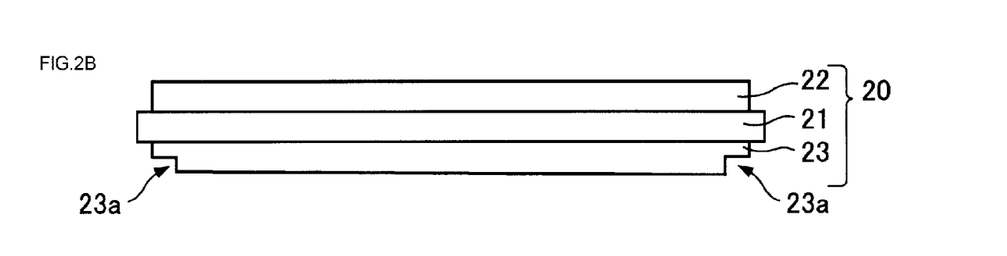

Also, FIGS. 2A and 2B are diagrams for describing an insulating substrate of the first embodiment. FIG. 2A shows a plan view of the side of the insulating substrate facing a radiating member, while FIG. 2B shows a sectional view taken along a dashed-dotted line X1-X1 of FIG. 2A.

Figure 3A:
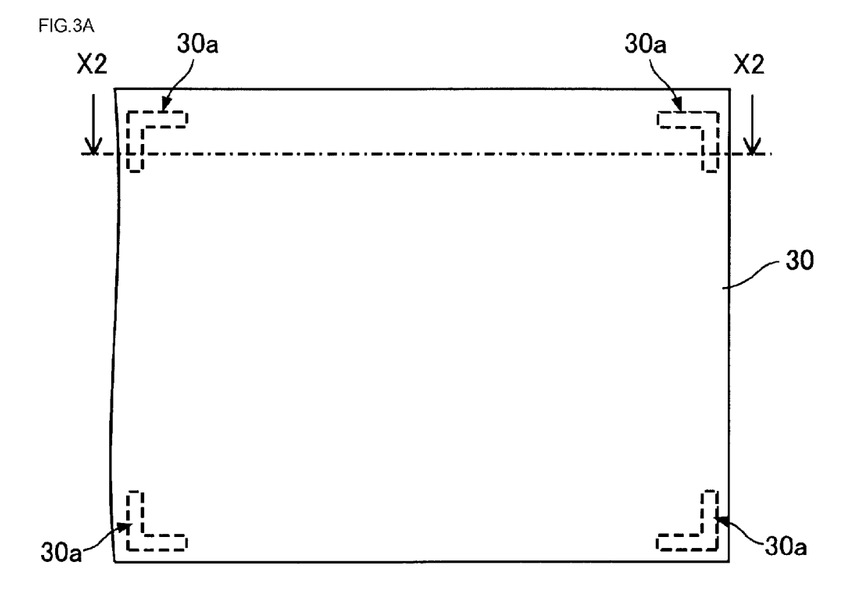
FIGS. 3A to 3C are diagrams for describing a radiating member of the first embodiment.
Figure 3B:
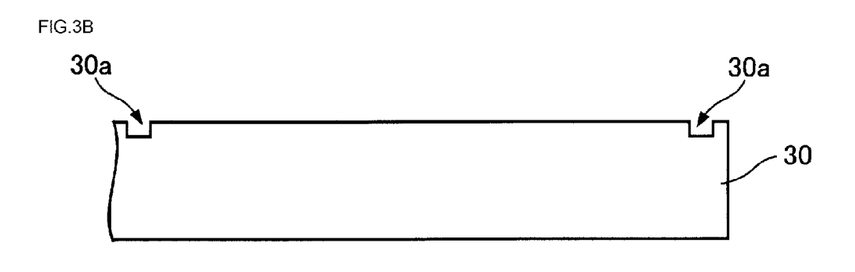
Figure 3C:
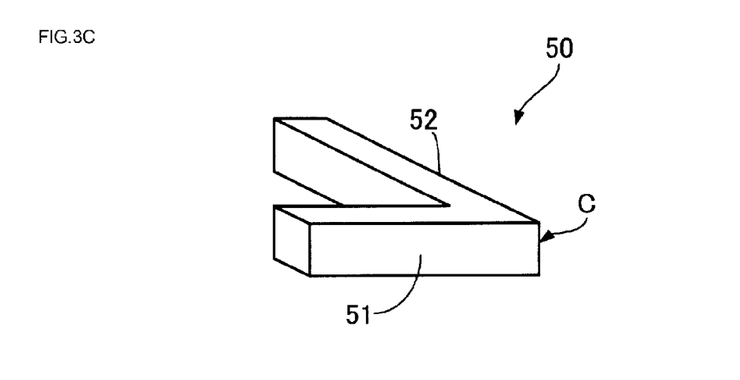

FIGS. 3A to 3C are diagrams for describing the radiating member of the first embodiment. FIG. 3A shows a plan view of the side of the radiating member facing the insulating substrate, FIG. 3B shows a sectional view taken along a dashed-dotted line X2-X2 of FIG. 3A, and FIG. 3C shows a perspective view of a positioning member. FIGS. 3A and 3B show only one of a plurality of arrangement areas provided on the radiating member.

A semiconductor device 10 includes semiconductor elements 60a and 60b, an insulating substrate 20, a radiating member 30, a positioning member 50, and solder 42, as shown in FIG. 1.

For example, a switching element can be applied as one of the semiconductor elements 60a and 60b, and a diode as the other.

For example, a vertical power semiconductor element, such as an insulated gate bipolar transistor (IGBT) or power metal-oxide-semiconductor field effect transistor (MOSFET), can be applied as the switching element. Also, for example, a power diode element, such as a Schottky barrier diode (SBD) or freewheeling diode (FWD), can be applied as the diode.

The embodiment is not limited to the two semiconductor elements 60a and 60b mounted on the insulating substrate 20, and it is possible to use semiconductor elements with necessary function and quantity in accordance with the design of the semiconductor device 10, and the like.

The insulating substrate 20 is formed by stacking a circuit plate 22, an insulating plate 21, and a metal plate 23, which are rectangular. A ceramic such as aluminum nitride or aluminum oxide is used for the insulating plate 21. The circuit plate 22 and metal plate 23 are formed from a metal such as copper, and can be formed using, for example, a direct copper bonding (DCB) method. The circuit plate 22 is formed such that a circuit pattern is selectively formed on the surface of the insulating plate 21. A main electrode side (for example, a collector electrode or cathode electrode) of the semiconductor elements 60a and 60b is fixed onto the circuit plate 22 using solders 72a and 72b. Also, a first groove portion 23a is provided in each of the four corners as shown in FIG. 2A, which shows a plan view of the metal plate 23. The first groove portion 23a has a shape corresponding to that of the positioning member 50 to be described hereafter. In this case, for example, the first groove portion 23a has an L-shape, and the apex of the L-shape is disposed so as to correspond with a corner portion of the metal plate 23. Also, the first groove portion 23a has a depth such that the bottom portion does not reach the insulating plate 21.

The radiating member 30 is formed from a metal such as copper or aluminum, and the insulating substrate 20 is fixed in a predetermined arrangement area of the radiating member 30. Further, the radiating member 30 has a function of cooling heat generated by the semiconductor elements 60a and 60b. Also, the radiating member 30 has a second groove portion 30a having a shape (herein, an L-shape) in accordance with that of the positioning member 50, to be described hereafter, in each of the four corners of the arrangement area of the insulating substrate 20 in plan view, as shown in FIGS. 3A and 3B. Also, each second groove portion 30a is disposed so as to face one of the first groove portions 23a of the insulating substrate 20.

In the first embodiment, each of the first groove portions 23a and each of the second groove portions 30a are provided in the four corners of the metal plate 23 and arrangement area respectively, thus, four of each of the first groove portions 23a and second groove portions 30a are disposed. However, the first groove portions 23a and second groove portions 30a are formed such that it is sufficient that each of the four positioning members 50 can be fitted into each of the four corners of each of the metal plate 23 and arrangement area, as will be described hereafter. Therefore, for example, it is possible to dispose one continuous first groove portion 23a or one continuous second groove portion 30a along a peripheral portion of the insulating substrate 20 or radiating member 30. Alternatively, it is possible to dispose two groove portions whereby two neighboring corners are joined.

The positioning member 50 is formed of a material having as a main component one of, for example, copper, nickel, and iron, which are materials that have high leakage with respect to solder. Alternatively, the surface of the positioning member 50 is covered with a material having as a main component one of, for example, copper, nickel, and iron, which are materials that have high leakage with respect to solder. Also, the positioning member 50 has an L-shape, and includes faces 51 and 52, and a corner portion C having the faces 51 and 52, as shown in FIG. 3C. Four positioning members 50 are disposed between the four corners of the metal plate 23 and the four corners of the radiating member 30, and are fitted into the first groove portions 23a in the four corners of the metal plate 23 and the second groove portions 30a in the four corners of the arrangement area. Further, the corner portions C of the positioning members 50 are positioned at the four corners of the insulating substrate 20. Also, the example shown is a case wherein a cross-section of the end portion of the positioning member 50 is a square, but not being limited to square, the cross-section of the end portion may be rectangular. Alternatively, the cross-section of the end portion of the positioning member 50 may be circular or elliptical. In this case, provided only that the positioning member 50 is structured to be an L-shape in plan view, there is no need to maintain that the positioning member 50 has the faces 51 and 52, and the corner portion C formed from the faces 51 and 52. Also, when the positioning member 50 is formed from the same material as, for example, the radiating member 30, the positioning member 50 can also be formed integrally in the place in which the second groove portion 30a of the radiating member 30 is formed.

The solder 42 is formed from a lead-free solder of a tin-silver series, or the like. The space between the insulating substrate 20 and radiating member 30 is filled with the solder 42, thereby joining the insulating substrate 20 and radiating member 30. Also, the solder 42 also has a function of transmitting heat generated from the semiconductor elements 60a and 60b from the insulating substrate 20 to the radiating member 30. Furthermore, the solder 42 covers the positioning members 50. This is because, as the surface of the positioning member 50 has high leakage with respect to solder, the solder 42 can leak outward so as to cover the positioning members 50.

The semiconductor device 10 including this kind of structure is formed such that the solder 42 spreads to the four corners of the insulating substrate 20 so as to cover the positioning members 50. Therefore, concentration of thermal strain is restricted in at least the four corners of the solder 42, even when conducting, for example, a temperature cycle test. Also, the semiconductor device 10 is formed such that the gap between the insulating substrate 20 and radiating member 30 is kept even by the positioning members 50 so that the solder 42 filling the gap is also even. Therefore, the conductivity of heat from the insulating substrate 20 to the radiating member 30 can be kept uniform, regardless of the place on the main surface of the insulating substrate 20.

Next, before describing a method of manufacturing this kind of semiconductor device 10, using FIGS. 4A to 5D, a description will be given of a conventional semiconductor device manufacturing method as a reference example.

FIGS. 4A to 5D are diagrams for describing a conventional semiconductor device manufacturing method as a reference example.

Figure 4A:
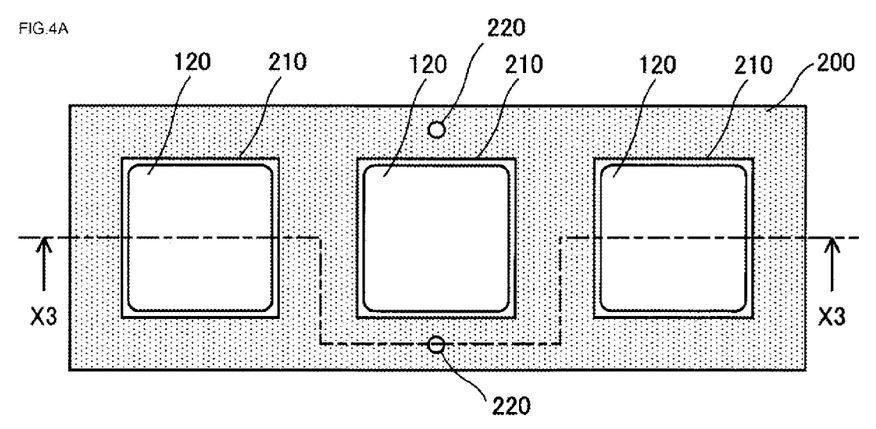
FIGS. 4A and 4B are first diagrams for describing a conventional semiconductor device manufacturing method as an example of reference.

Semiconductor elements mounted on an insulating substrate are omitted from FIGS. 4A to 5D. Also, FIG. 4A shows a plan view of a positioning jig, while FIG. 4B shows a sectional view taken along a dashed-dotted line X3-X3 of FIG. 4A. Also, FIGS. 5A to 5D are sectional views wherein a radiating member on the right side of FIGS. 4A and 4B and an insulating substrate disposed on the radiating member are enlarged, and show steps of joining the insulating substrate and radiating member using solder.

Figure 4B:
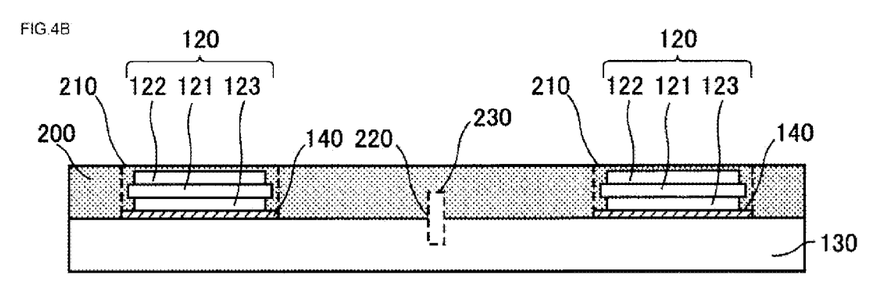

Firstly, a positioning jig 200 having one or more aperture portions 210 is set on a radiating member 130 formed from a metal, such as copper or aluminum, that has a certain thermal conductivity or higher. The positioning jig 200 is formed from a material with low leakage with respect to solder, for example, a carbon material, so that solder does not adhere when soldering. A plating process is performed on the radiating member 130 using, for example, nickel. Due to the plating process, oxidation is prevented when the radiating member 130 is formed from copper, and joinability to solder is improved when the radiating member 130 is formed from aluminum.

Also, when setting the positioning jig 200, a positioning hole 220 of the positioning jig 200 is fitted over a positioning pin 230 fixed to the radiating member 130. Further, the positioning jig 200 is fixed so that the aperture portions 210 of the positioning jig 200 are each positioned in a predetermined arrangement area on the radiating member 130.

Next, a solder plate 140 is mounted in the aperture portion 210 of the positioning jig 200 set on the radiating member 130, after which an insulating substrate 120 is mounted on the solder plate 140 (FIGS. 4A and 4B).

The insulating substrate 120, in the same way as the insulating substrate 20 of the semiconductor device 10, is rectangular, and includes an insulating plate 121, and a circuit plate 122 and metal plate 123 disposed on the front and back surfaces of the insulating plate 121.

Next, a description will be given of steps of joining the insulating substrate 120 and radiating member 130 using solder.

Figure 5A:
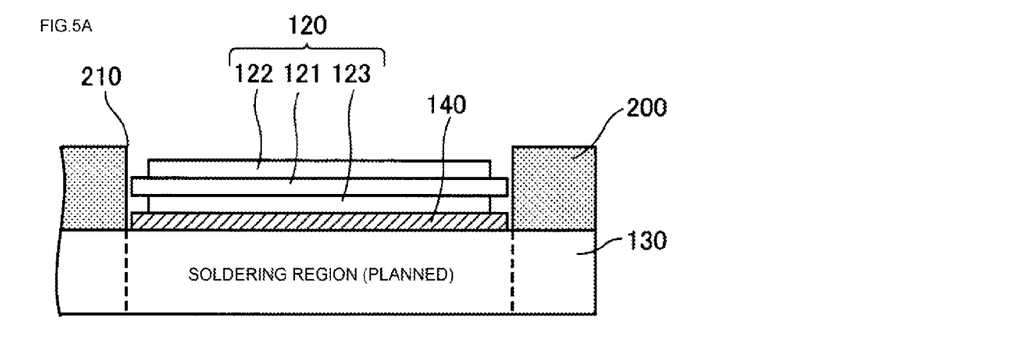
FIGS. 5A to 5D are second diagrams for describing a conventional semiconductor device manufacturing method as an example of reference.

As heretofore described, the insulating substrate 120 is set across the solder plate 140 in an arrangement area A (soldering region (planned)) on the radiating member 130 using the positioning jig 200 (FIG. 5A).

Figure 5B:
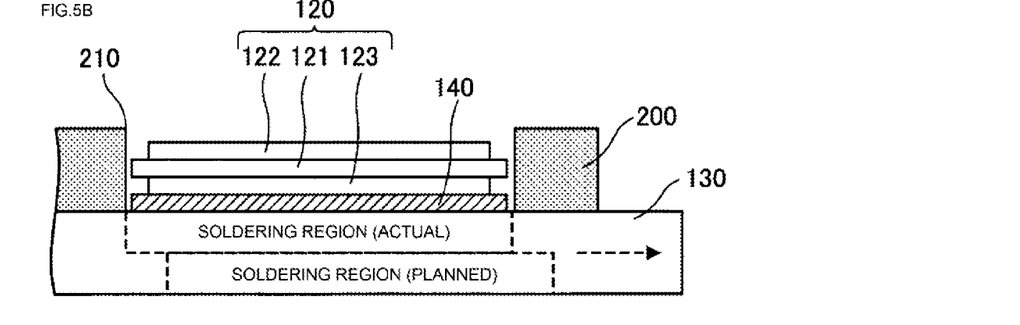

In this state, the whole configuration is heated at a temperature at which the solder plate 140 melts. By so doing, as the thermal expansion coefficient of the radiating member 130 is greater than that of the positioning jig 200, and the radiating member 130 and positioning jig 200 are fixed to each other by the positioning pin 230, the radiating member 130 spreads outward (to the right in FIGS. 5A to 5D) beyond the positioning jig 200, centered on the positioning pin 230. Further, due to the spread of the radiating member 130, deviation occurs between the original soldering region (planned) of the insulating substrate 120 and the soldering region (actual) (FIG. 5B). In particular, the deviation becomes more obvious as the distance from the positioning pin 230 increases.

Figure 5C:
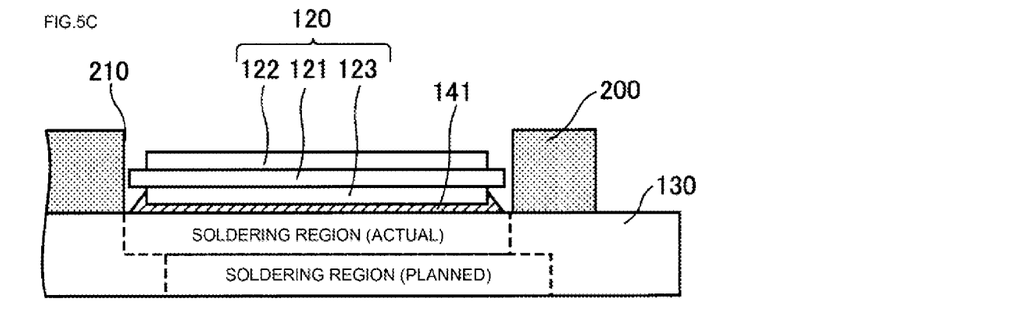

In the state in which the soldering region has deviated in this way, solder 141 melted from the solder plate 140 fills the space between the insulating substrate 120 and radiating member 130 (FIG. 5C).

Figure 5D:
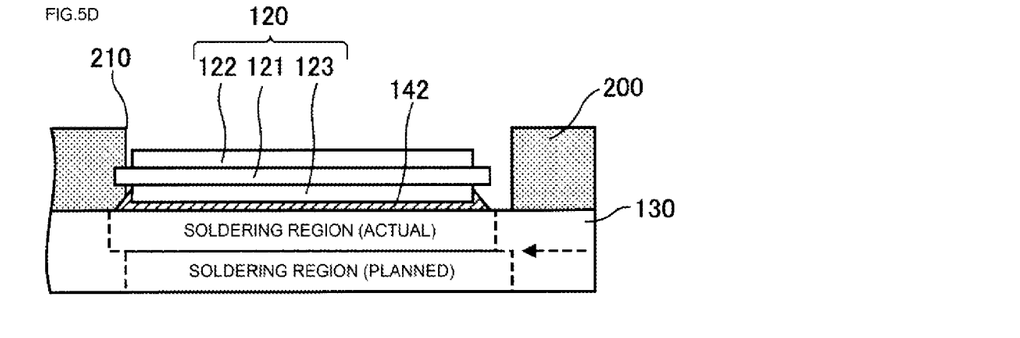

Next, the solder 141 filling the space between the insulating substrate 120 and radiating member 130 is cooled, whereby the insulating substrate 120 and radiating member 130 are joined by solder 142 hardened from the solder 141. By the whole configuration being cooled at this time, the radiating member 130 contracts, and moves inward (to the left in FIGS. 5A to 5D). The insulating substrate 120 also moves inward together with the contraction of the radiating member 130. Meanwhile, inward contraction of the positioning jig 200 is less than that of the insulating substrate 120. Therefore, it may happen that an end portion of the insulating substrate 120 contacts an inner wall of the aperture portion 210 of the positioning jig 200, and damages the insulating substrate 120 (FIG. 5D).

In order to prevent this kind of contact between the insulating substrate 120 and the inner wall of the aperture portion 210, for example, increasing the aperture area of the aperture portion 210 of the positioning jig 200 is conceivable. When increasing the aperture area, however, there is a decrease in the accuracy of disposing the insulating substrate 120 in the arrangement area on the radiating member 130.

Next, a description will be given, using FIGS. 6A to 6C, of a reference example of a semiconductor device manufactured in this way. Semiconductor elements mounted on the insulating substrate 120 are omitted from FIGS. 6A to 6C.

Figure 6A:
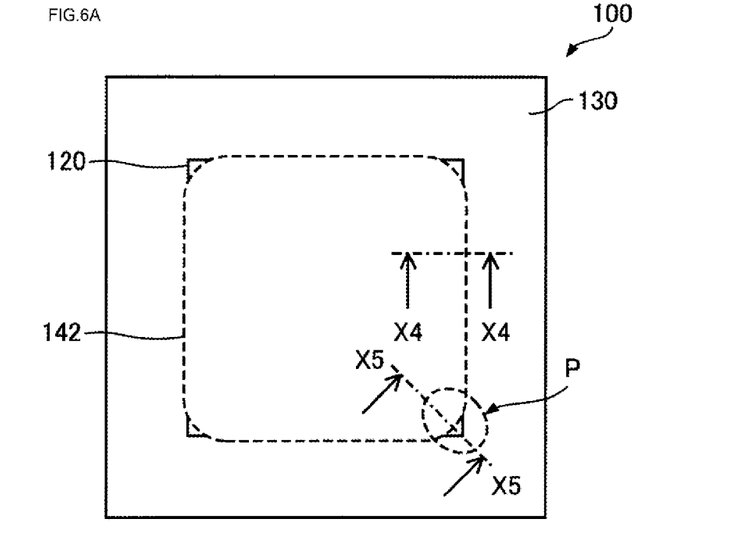
FIGS. 6A to 6C are diagrams for describing a conventional semiconductor device as an example of reference.
Figure 6B:
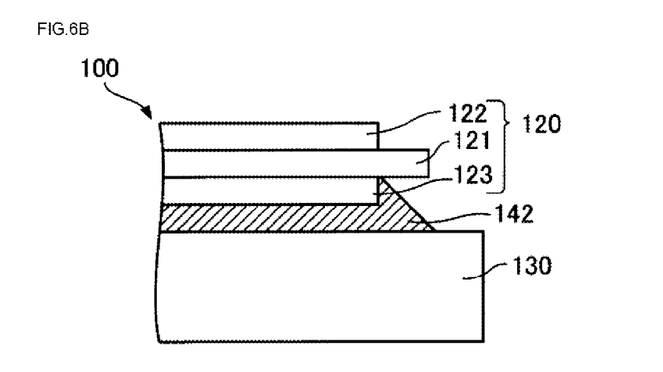
Figure 6C:
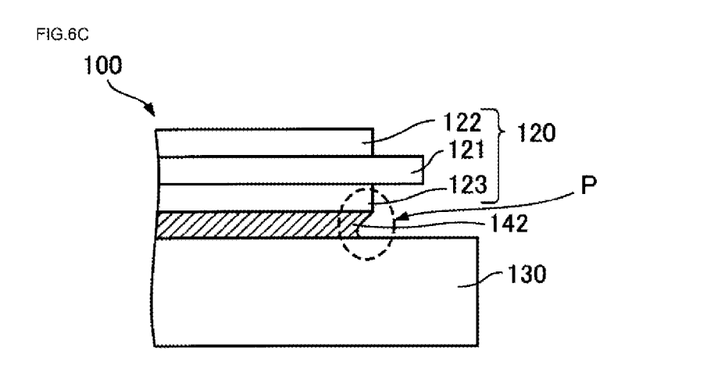

FIG. 6A shows a plan view of the insulating substrate 120 joined to the radiating member 130, while FIGS. 6B and 6C show sectional views taken along the dashed-dotted lines X4-X4 and X5-X5 respectively of FIG. 6A.

In a semiconductor device 100 manufactured via the steps of FIGS. 4A to 5D, it may happen that the solder 142 joining the insulating substrate 120 and radiating member 130 does not spread to the four corners of the insulating substrate 120, as shown by the broken line in FIG. 6A. This is caused by thermal contraction of the solder 142 when cooled, and is obvious in the four corners, of which a considerable portion is exposed to the exterior. The details are explained below.

For example, it is assumed that the amount of solder 142 is adjusted, and a good fillet form, wherein the solder 142 spreads downward, can be formed in the vicinity of the center of a side of the insulating substrate 120 (FIG. 6B).

In this case, however, as contraction of the solder 142 advances from two sides at a corner portion of the insulating substrate 120, an indentation occurs at a corner portion P of the solder 142, as shown In FIG. 6C. When a temperature change occurs when operating in the semiconductor device 100 wherein indentation has occurred at the corner portion P of the solder 142 in this way, thermal strain concentrates in the indentation, and fatigue damage occurs, which may cause breakdown or damage of the semiconductor device 100.

Meanwhile, when attempting to form a good fillet shape, wherein no indentation occurs in the corner portion P, by increasing the amount of the solder 142, the amount of solder is excessive in the vicinity of the center of a side. Therefore, there may occur a problem such as the solder 142 overflowing in the vicinity of the center of a side, encroaching as far as the circuit plate 122, and causing a short-circuit.

Also, the semiconductor device 100 is formed such that the insulating substrate 120 is simply disposed across the solder 141 on the radiating member 130 by, for example, the steps of joining using solder in FIGS. 5A to 5D. Therefore, it is also conceivable that the insulating substrate 120 inclines with respect to the radiating member 130 when the solder 141 melts. When the insulating substrate 120 is joined in an inclined state with respect to the radiating member 130, the thickness of the solder 142 differs depending on the position thereof on the main surface of the insulating substrate 120. In this kind of semiconductor device 100, variation occurs in the conductivity of heat from the insulating substrate 120 to the radiating member 130.

There is a possibility of a decrease in the reliability of the semiconductor device 100 manufactured via the steps of FIGS. 4A to 5D in this way.

Therefore, a description will be given, using FIGS. 1 to 3C and FIGS. 7A to 7D, of a method of manufacturing the semiconductor device 10 of the first embodiment.

The mounting, and steps of fixing, the semiconductor elements fixed onto the insulating substrate are omitted from FIGS. 7A to 7D. Also, in the same way as FIGS. 5A to 5D, FIGS. 7A to 7D are sectional views wherein the radiating member and the insulating substrate disposed in one place on the radiating member are enlarged, and show steps of joining the insulating substrate and radiating member using solder. Also, descriptions of portions duplicating the description of FIGS. 1 to 3C may be omitted.

Firstly, the insulating substrate 20 having the configuration illustrated in FIGS. 2A and 2B is prepared. Also, the radiating member 30 having the configuration illustrated in FIGS. 3A and 3B is prepared.

Figure 7A:
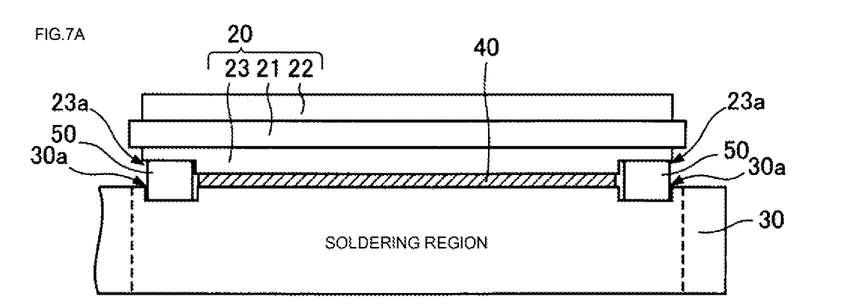
FIGS. 7A to 7D are diagrams for describing a semiconductor device manufacturing method of the first embodiment.

Next, the four positioning members 50 illustrated in FIG. 3C are fitted one each into the second groove portions 30a in the four corners of the predetermined arrangement area (soldering region) on the radiating member 30. Also, a solder plate 40 is mounted in the arrangement area on the radiating member 30. Furthermore, each of the four positioning members 50 is fitted into the first groove portions 23a in the four corners of the metal plate 23 of the insulating substrate 20, thereby fixing the insulating substrate 20 to the predetermined arrangement area on the radiating member 30 (FIG. 7A). After this step, a gap of a predetermined distance, which is the thickness of the solder 42 in the semiconductor device 10, is provided uniformly between the insulating substrate 20 and radiating member 30.

Figure 7B:
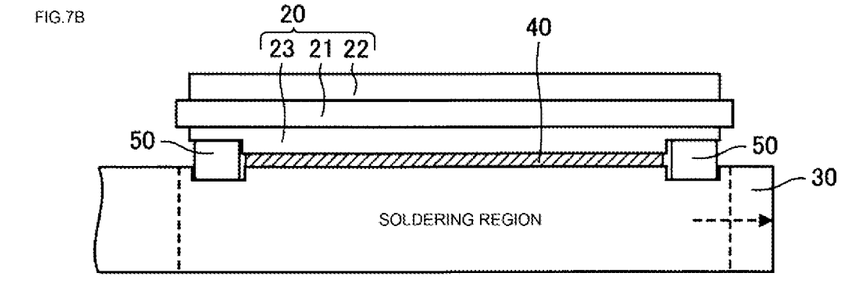

Next, the whole configuration is heated at a temperature at which the solder plate 40 melts, thereby melting the solder plate 40. The radiating member 30 expands when heated, spreading outward (to the right in FIGS. 7A to 7D). At this time, as the insulating substrate 20 is positioned on the radiating member 30 by the positioning members 50, the insulating substrate 20 moves outward together with the expansion of the radiating member 30 (FIG. 7B). Therefore, the insulating substrate 20 does not deviate from the planned soldering region, even though the heated radiating member 30 expands.

Figure 7C:
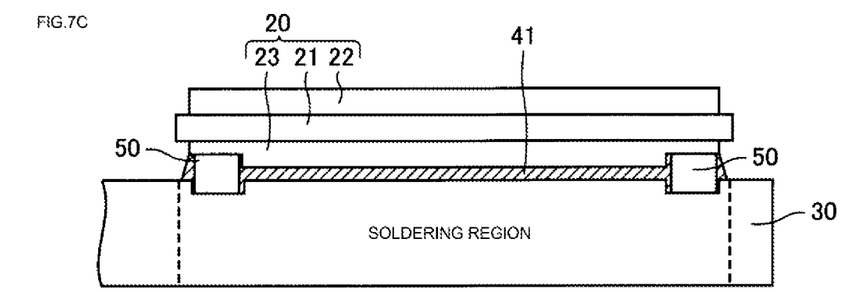

Solder 41 melted from the heated solder plate 40 spreads outward in the gap between the insulating substrate 20 and radiating member 30, thereby filling the gap. Also, as the surface of the positioning member 50 has high leakage with respect to the solder 41, as heretofore described, the solder 41 that reaches the positioning members 50 spreads further outward while covering the positioning members 50. Further, the corner portion C of the positioning member 50 is disposed in each of the four corners of the insulating substrate 20, as heretofore described, because of which, when the solder 41 completely covers the positioning members 50 as far as the corner portion C, the solder 41 reaches each of the four corners of the insulating substrate 20 (FIG. 7 (C)).

Also, as the bottom portion of the first groove portion 23a is of a depth not reaching the insulating plate 21, the insulating plate 21, which has low leakage, is not exposed in the first groove portion 23a. Therefore, the solder 41, without being impeded when spreading, spreads to the four corners of the insulating substrate 20 while covering the positioning members 50.

Figure 7D:
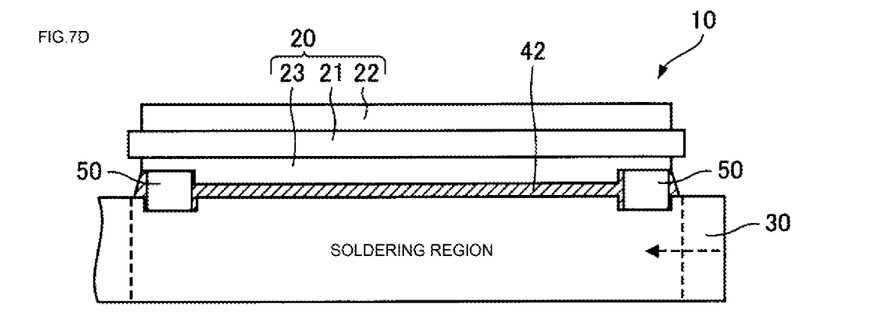

Next, the melted solder 41 is cooled and hardened, whereby the insulating substrate 20 and radiating member 30 are joined by the solder 41 (FIG. 7D). Thereupon, the expanded radiating member 30 contracts (to the left in FIGS. 7A to 7D). At this time, the insulating substrate 20 positioned by the positioning members 50 on the radiating member 30 moves together with the contraction of the radiating member 30, in a direction opposite to that when the radiating member 30 expands. Also, at this time of contraction, the insulating substrate 20 is subjected to no damage or the like, nor does the insulating substrate 20 deviate from the planned soldering region, as the positioning jig 200 shown in FIGS. 5A to 5D is not used.

Next, a description will be given, using FIGS. 8A to 8C, of the semiconductor device 10 of the first embodiment manufactured in this way.

Figure 8A:
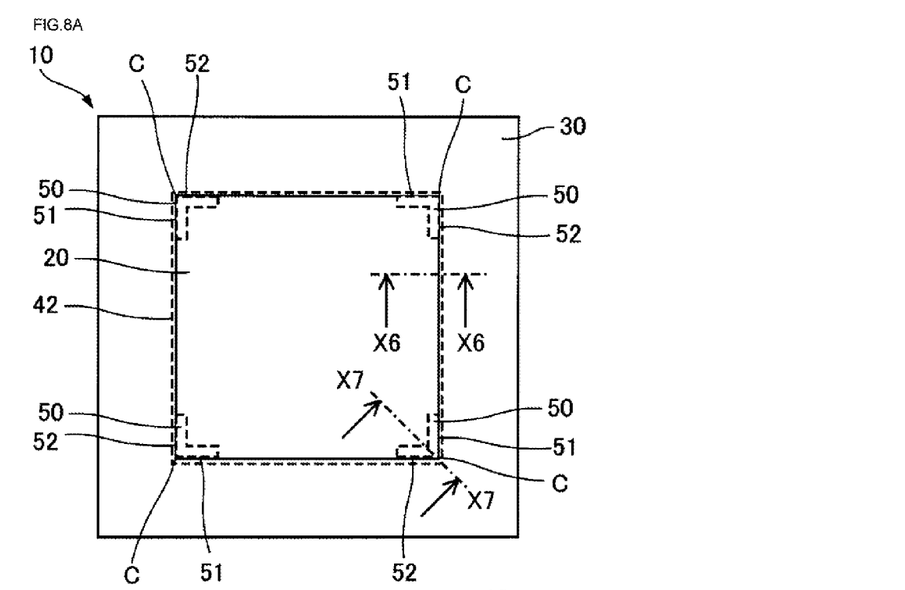
FIGS. 8A to 8C are diagrams for describing the semiconductor device of the first embodiment.
Figure 8B:
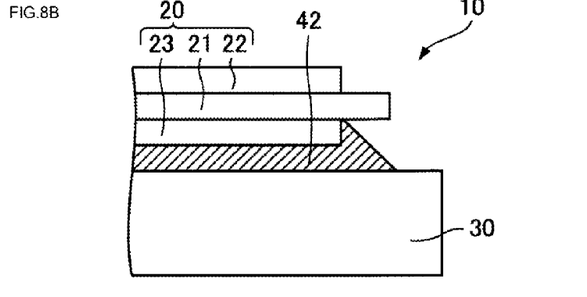
Figure 8C:
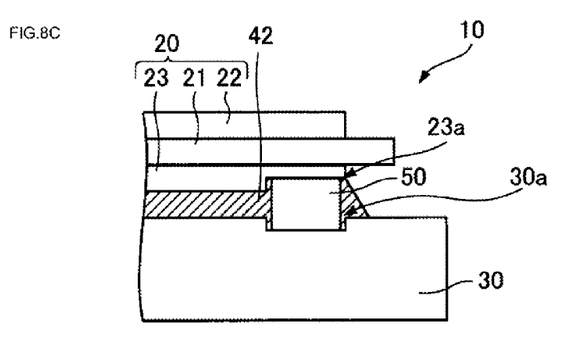

FIG. 8A shows a plan view of the semiconductor device 10, while FIGS. 8B and 8C show sectional views taken along the dashed-dotted lines X6-X6 and X7-X7 of FIG. 8A.

In the semiconductor device 10 manufactured via the steps illustrated in FIGS. 7A to 7D, the solder 42 spreads to the four corners of the insulating substrate 20, thereby joining the insulating substrate 20 and radiating member 30, as shown by the broken line in FIG. 8A.

For example, the solder 42 includes a good fillet shape spread downward in the vicinity of the center of a side of the insulating substrate 20, as shown in FIG. 8B.

Also, regarding the four corner portions of the insulating substrate 20, the solder 42 covers the positioning members 50, spreading to the four corners of the insulating substrate 20, as shown in FIG. 8C. Furthermore, the solder 42 includes a good fillet shape spread downward.

Therefore, even when a temperature change occurs when operating in this kind of semiconductor device 10, there is no concentration of thermal strain in an end portion of the solder 42, and the temperature cycle resistances improve.

When the angle of the corner portion C of the positioning member 50 is acute, the solder 42 can be more effective to reach each of the four corners of the insulating substrate 20. Further, it is preferable that the angle of the corner portion C is a right angle corresponding to the corner portion of the insulating substrate 20.

Furthermore, in the first embodiment, a predetermined and uniform thickness of the solder 42 can be obtained by controlling the height of the positioning member 50 and the depth of the first groove portion 23a and second groove portion 30a. Therefore, the conductivity of heat from the insulating substrate 20 to the radiating member 30 is of a desired value and uniform, regardless of the place on the main surface of the insulating substrate 20. Consequently, the semiconductor device 10 of the first embodiment is formed such that an increase in reliability can be achieved.

Second Embodiment

In a second embodiment, a description will be given of a case wherein a positioning member of another form is applied in the first embodiment. A description of portions duplicating the description of the first embodiment may be omitted.

Figure 9A:
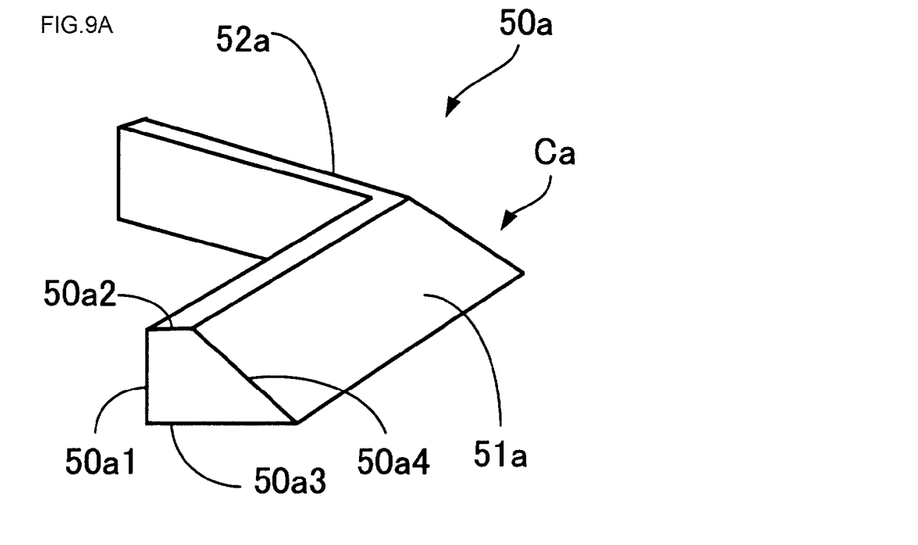
FIGS. 9A and 9B are diagrams for describing a semiconductor device of a second embodiment.
Figure 9B:
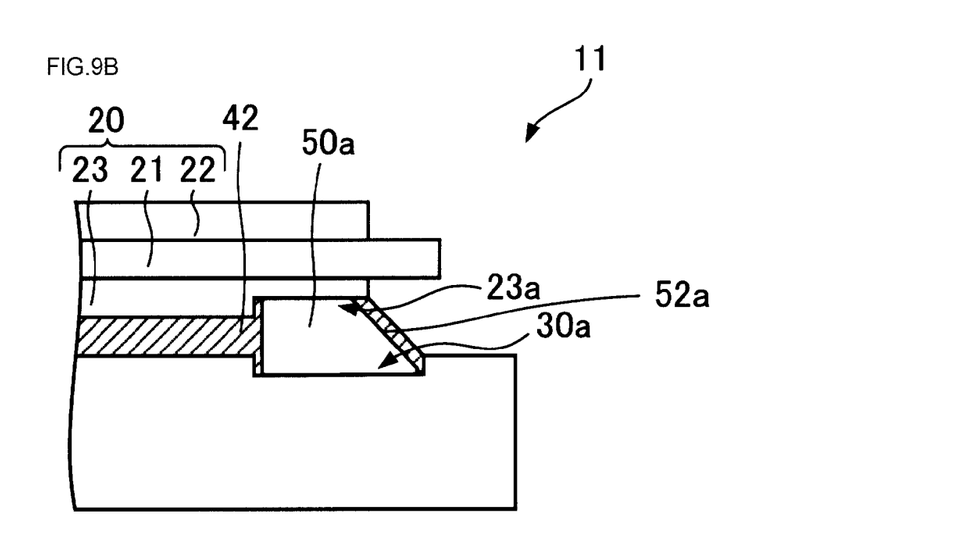

FIGS. 9A and 9B are diagrams for describing a semiconductor device of the second embodiment.

FIG. 9A shows a perspective view of a positioning member of the second embodiment, while FIG. 9B, corresponding to FIG. 8C, shows a sectional view of a corner portion of a semiconductor device using FIG. 9A.

A positioning member 50a shown in FIG. 9A, in the same way as the positioning member 50, has a surface with high leakage with respect to solder, is of an L-shape in plan view, and includes faces 51a and 52a, and a corner portion Ca configured of the faces 51a and 52a. However, the cross-section of an end portion of the positioning member 50a is a trapezoidal shape wherein sides 50a2 and 50a3 are perpendicular, and a side 50a4 is inclined, with respect to a side 50a1. Also, together with the inclination of the side 50a4, the faces 51a and 52a are also formed such that the insulating substrate 20 side thereof inclines to the inner side of the insulating substrate 20.

Further, the first groove portion 23a of the insulating substrate 20 and the second groove portion 30a of the radiating member 30 have a groove form formed in accordance with the shape of the positioning member 50a, so that the positioning member 50a can be fitted.

A semiconductor device 11 to which the positioning member 50a is applied is shown in FIG. 9B. In the same way as the semiconductor device 10, the semiconductor device 11 is formed such that the solder 42 fills the gap between the insulating substrate 20 and radiating member 30, and the solder 42 covers the positioning members 50a, spreading to the four corners of the insulating substrate 20. Furthermore, in the case of the positioning member 50a, the solder 42 covers the inclined faces 51a and 52a of the positioning member 50a so that the solder 42 can form a good fillet shape spreading downward. Therefore, concentration of thermal strain in an end portion of the solder 42 is further restricted, and the temperature cycle resistances improve further.

Third Embodiment

In a third embodiment, a description will be given of a case wherein a positioning member of another shape is still applied in the first embodiment.

Figure 10A:
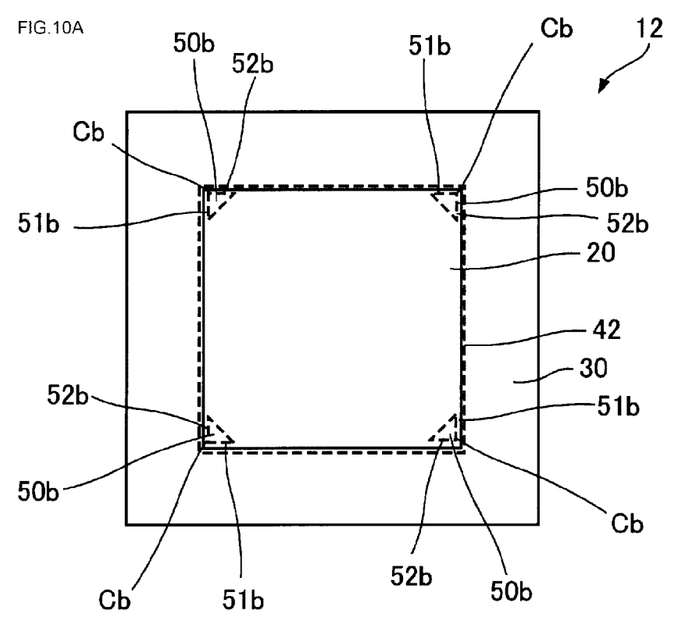
FIGS. 10A and 10B are diagrams for describing a semiconductor device of a third embodiment.
Figure 10B:
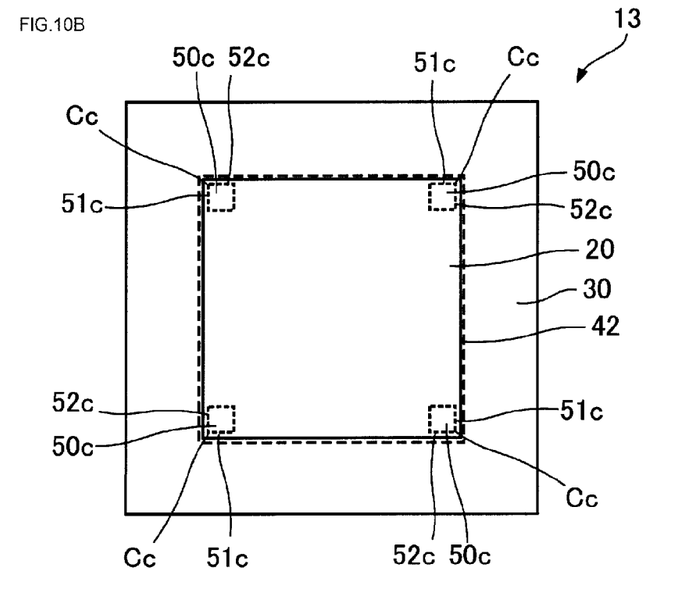

FIGS. 10A and 10B are diagrams for describing a semiconductor device of the third embodiment.

As the positioning member 50 is formed such that the corner portion C formed from the faces 51 and 52 is positioned in each of the four corners of the insulating substrate 20, the melted solder 41 completely buries the faces 51 and 52 and the corner portion C of the positioning members 50 to reach the four corners of the insulating substrate 20.

For example, in a semiconductor device 12, a positioning member 50b has a triangular shape in plan view, including faces 51b and 52b, and a corner portion Cb configured of the faces 51b and 52b, as shown in FIG. 10A. In this case, by the faces 51b and 52b, and the corner portion Cb formed from the faces 51b and 52b, being positioned in each of the four corners of the insulating substrate 20, the same advantages as with the positioning member 50 are obtained. Furthermore, provided that the cross-section of an end portion of the positioning member 50b has the same trapezoidal shape as the cross-section of the end portion of the positioning member 50a, the same advantages as with the positioning member 50a are obtained.

Also, in a semiconductor device 13, a positioning member 50c has a quadrilateral shape in plan view, including faces 51c and 52c, and a corner portion Cc formed from the faces 51c and 52c, as shown in FIG. 10B. In this case, by the faces 51c and 52c, and the corner portion Cc formed from the faces 51c and 52c, being positioned in each of the four corners of the insulating substrate 20, the same advantages as with the positioning member 50 are obtained. Furthermore, also, in this case, provided that the cross-section of an end portion of the positioning member 50c has the same trapezoidal shape as the cross-section of the end portion of the positioning member 50a, the same advantages as with the positioning member 50a are obtained.

In order to not decrease the reliability of the semiconductor devices 10 to 13, it is desirable that the positioning members 50, 50a, 50b, and 50c have a size that a localized amount of the solder 42 in the four corners of the insulating substrate 20 does not overly decrease.

What is claimed is:

1. A semiconductor device, comprising:
a semiconductor element;
an insulating substrate having a rectangular shaped circuit plate, an insulating plate, and a metal plate, which are stacked together, wherein the semiconductor element is fixed to the circuit plate, and the metal plate has at least one first groove portion provided in four corners thereof;
a radiating member made of metal and having a predetermined arrangement area to dispose the insulating substrate, the radiating member having at least one second groove portion provided in four corners of the arrangement area;
four positioning members disposed between the four corners of the metal plate and the four corners of the radiating member, each of the four positioning members being fitted to the first groove portion and the second groove portion; and
a solder filling a space between the insulating substrate and the radiating member, and covering the positioning members,
wherein the metal plate has a top surface fixed directly to the insulating plate on a side opposite to the circuit plate, and a bottom surface opposite to the top surface formed with said at least one first groove portion, and
a remainder of an entire bottom surface not formed with said at least one first groove portion is attached to the radiating member through the solder.

2. The semiconductor device according to claim 1, wherein the first groove portion includes four groove portions each provided in each of the four corners of the metal plate, and
the second groove portion includes four groove portions each provided in the four corners of the arrangement area.

3. The semiconductor device according to claim 1, wherein the first groove portion has a depth in which a bottom portion of the first groove portion does not extend to the insulating plate.

4. The semiconductor device according to claim 1, wherein the positioning member includes a first face, a second face, and a corner portion formed from the first face and the second face and disposed in one of the four corners of the insulating substrate.

5. The semiconductor device according to claim 4, wherein the positioning member has an L-shape, a rectangular shape, or a triangular shape.

6. The semiconductor device according to claim 4, wherein the first face and the second face of the positioning member are inclined to an inner side of the insulating substrate from a radiating member side toward an insulating substrate side.

7. The semiconductor device according to claim 1, wherein the insulating substrate and radiating member are parallel.

8. The semiconductor device according to claim 1, wherein said at least one second groove portion is arranged below said at least first groove portion, and
   at least one positioning member of the four positioning members is disposed in said at least one second groove portion and said at least first groove portion to position the insulating substrate to the predetermined arrangement area on the radiating member.

9. The semiconductor device according to claim 8, wherein said at least one first groove portion provided in corners is arranged at a periphery of the metal plate.

10. A semiconductor device, comprising:
    a semiconductor element;
    an insulating substrate having a rectangular shaped circuit plate, an insulating plate, and a metal plate, which are stacked together, wherein the semiconductor element is fixed to the circuit plate, and the metal plate has at least one first groove portion provided in four corners thereof;
    a radiating member made of metal and having a predetermined arrangement area to dispose the insulating substrate, the radiating member having at least one second groove portion provided in four corners of the arrangement area;
    four positioning members disposed between the four corners of the metal plate and the four corners of the radiating member, each of the four positioning members being fitted to the first groove portion and the second groove portion; and
    a solder filling a space between the insulating substrate and the radiating member, and covering the positioning members,
    wherein the positioning member is formed from a material having copper, nickel, or iron as a main component, or
    a surface of the positioning member is covered with a material having copper, nickel, or iron as a main component.

11. A semiconductor device manufacturing method, comprising:
    a step of preparing an insulating substrate formed from stacking a rectangular shaped circuit plate, insulating plate, and metal plate, the metal plate having at least one first groove portion provided in four corners thereof;
    a step of preparing a radiating member made of metal, the radiating member having at least one second groove portion provided in four corners of an arrangement area disposing the insulating substrate;
    a step of fitting four positioning members in the second groove portion in the four corners of the arrangement area;
    a step of mounting a solder plate in the arrangement area;
    a step of fitting the four positioning members in the first groove portion in the four corners of the metal plate, to fix the insulating substrate to the arrangement area;
    a step of heating and melting the solder plate;
    a step of filling a space between the insulating substrate and the radiating member with a solder melted from the solder plate; and
    a step of cooling and hardening the melted solder.

12. The semiconductor device manufacturing method according to claim 11, further comprising a step of covering the positioning member with the melted solder after the step of heating and melting the solder plate.

* * * * *